(12) United States Patent
Koay et al.

(10) Patent No.: US 8,760,328 B1
(45) Date of Patent: Jun. 24, 2014

(54) INTERFACE CIRCUITRY FOR AN INTEGRATED CIRCUIT SYSTEM

(75) Inventors: Wei Yee Koay, Bayan Lepas (MY); Chin Ghee Ch'ng, Gelugor (MY); Ket Chiew Sia, Bayan Lepas (MY); Tony Ngai, Saratoga, CA (US); Sean Woei Voon, Bukit Mertajam (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/620,126

(22) Filed: Sep. 14, 2012

(51) Int. Cl.
*H03M 9/00* (2006.01)

(52) U.S. Cl.
USPC .......................................... 341/100; 341/101

(58) Field of Classification Search
USPC .................. 341/100, 101; 710/310, 307, 315; 370/229, 394; 714/708; 375/316
See application file for complete search history.

(56) References Cited

U.S. PATENT DOCUMENTS

| | | | |
|---|---|---|---|
| 5,247,652 A | 9/1993 | Uda | |
| 5,396,428 A | 3/1995 | Tichborne et al. | |
| 5,798,720 A | 8/1998 | Yano | |
| 6,910,092 B2 * | 6/2005 | Calvignac et al. | 710/310 |
| 7,376,021 B2 | 5/2008 | Heo et al. | |
| 7,757,022 B2 | 7/2010 | Kato et al. | |
| 7,924,184 B1 | 4/2011 | Chan et al. | |
| 2002/0122503 A1 * | 9/2002 | Agazzi | 375/316 |
| 2005/0219084 A1 | 10/2005 | Dietrich et al. | |

FOREIGN PATENT DOCUMENTS

EP  1600784  11/2005

* cited by examiner

*Primary Examiner* — Joseph Lauture
(74) *Attorney, Agent, or Firm* — Michael H. Lyons

(57) ABSTRACT

An integrated circuit system may include a first integrated circuit (IC), a second IC, and interface circuitry. The first IC is operable to output a parallel data stream at a first data rate. The second IC is operable to output a serialized data stream at a second date rate. The second data rate may be different than the first data rate. The interface circuitry may be coupled between the first integrated circuit and the second integrated circuit. The interface circuitry may be operable to convert the parallel data stream received from the first IC into a serialized data stream with the second data rate. The interface circuitry may be also operable to convert the serialized data stream received from the second IC to a parallel data stream with the first data rate.

22 Claims, 13 Drawing Sheets

INTERFACE CIRCUITRY FOR AN INTEGRATED CIRCUIT SYSTEM

BACKGROUND

Generally, a single integrated circuit (IC) is placed within an IC package. However, recent technology trends allow multiple integrated circuits to be included in a single IC package. Such practice has created many different types of integrated circuit systems including System-on-Chip (SoC), package-on-package (PoP), stacked dies, etc.

It may be difficult to package multiple integrated circuits within a single IC package. One of the common difficulties in packaging multiple integrated circuits in a single package includes needing a mechanism to transmit data between the multiple integrated circuits that may potentially be operating at different data rates. This issue is pertinent when a programmable integrated circuit, which typically operates at a lower data rate, and a memory device, which typically operates at a higher date rate, are formed within a single package.

This problem can be mitigated by various design solutions. As an example, data may be transferred using more interconnections between two integrated circuits. However, such a solution is restricted by the number of interconnections available.

SUMMARY

Embodiments described herein include interface circuitry for an integrated circuit (IC) system. It should be appreciated that the embodiments can be implemented in numerous ways, such as a process, an apparatus, a system, a device, or a method. Several embodiments are described below.

In one embodiment, the IC system may include a first integrated circuit (IC), a second IC, and interface circuitry. The first IC is operable to output parallel data streams at a first data rate. The second IC is operable to output a serialized data stream at a second date rate. The second data rate may be different from the first data rate or may be equal to the first data rate. The interface circuitry may be coupled between the first IC and the second IC. The interface circuitry is operable to convert the parallel data streams received from the first IC into serialized data streams with the second data rate. The interface circuitry is also operable to convert the serialized data stream received from the second IC into parallel data streams with the first data rate.

In another suitable embodiment, an integrated circuit includes logic circuitry and interface circuitry. The logic circuitry is operable at a first data rate. The interface circuitry is coupled to the logic circuitry and may be operable to receive first and second clock signals. The interface circuitry is operable to receive a first parallel data stream at the first data rate from the logic circuitry and is further operable to convert the first parallel data stream into a first serialized data stream at a second data rate.

Further features of the invention, its nature and various advantages will be more apparent from the accompanying drawings and the following detailed description of the preferred embodiments.

DETAILED DESCRIPTION

The following embodiments describe interface circuitry for an integrated circuit (IC) system. It will be obvious, however, to one skilled in the art, that the present exemplary embodiments may be practiced without some or all of these specific details. In other instances, well-known operations have not been described in detail in order to prevent unnecessarily obscuring the present embodiments.

In one embodiment, interface circuitry with serializer and deserializer circuitry is provided. The interface circuitry may serve to provide an efficient way of maximizing data bandwidth given a limited number of interconnections. The interface circuitry may also provide communications among multiple integrated circuits within a single multi-chip package. If desired, the interface circuitry may be programmed to convert between different predefined data rates.

Figure 1:
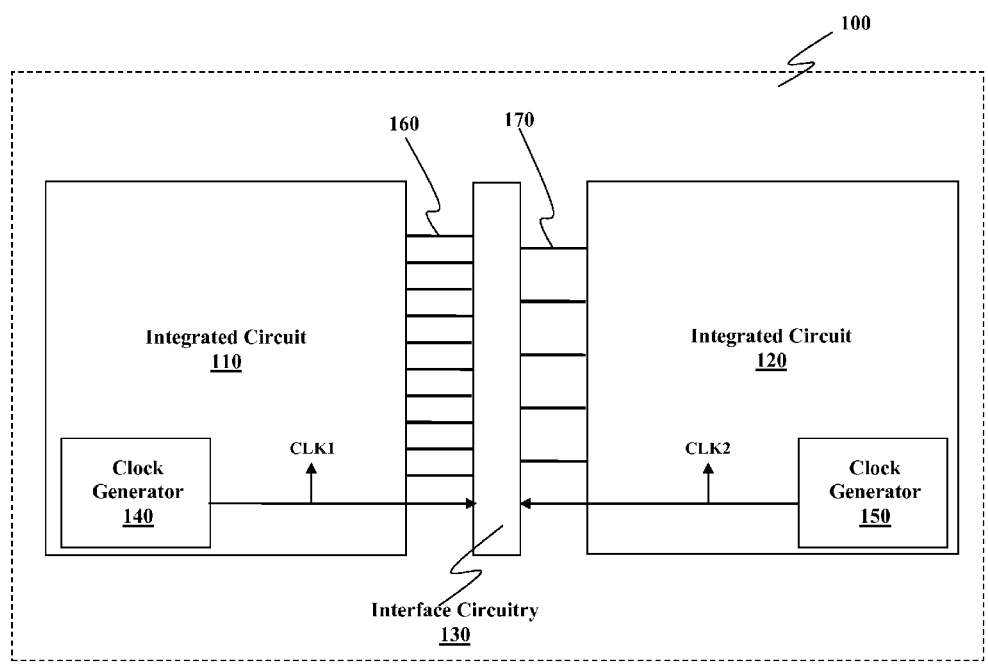
FIG. 1 is an integrated circuit (IC) system in accordance with an embodiment of present invention.

FIG. 1, meant to be illustrative and not limiting, illustrates integrated circuit (IC) system 100 in accordance with one embodiment of the present invention. Integrated circuit system 100 includes integrated circuits 110 and 120, interface circuitry 130 and interconnect paths 160 and 170. It should be appreciated that a function of IC system 100 may be determined by a combined functionality of IC 110 and IC 120. Integrated circuit system 100 may be a stacked dies system, a System-on-Package (SoP), a Package-on-Package (PoP), etc.

In the exemplary embodiment of FIG. 1, IC 110 is placed in the left region of IC system 100 and IC 120 is placed in the right region of IC system 100. It should be appreciated that ICs 110 and 120 may be placed on a conductive material (not illustrated in FIG. 1) that provides a means for communication between IC 110 and IC 120. In one exemplary embodiment, the conductive material may be a silicon interposer.

In an alternative embodiment, ICs 110 and 120 may be stacked on top of each other to form a stacked structure. It should be appreciated that such a stacked structure is commonly known as a 3-dimensional (3D) package. ICs 110 and 120 may include identical or different circuitry. In an exemplary embodiment, IC 110 may be a Field Programmable Gate Array (FPGA) device and IC 120 may be a memory module. As such, in this embodiment, IC 120 may be used for hardening an FPGA configuration or for providing a larger memory storage for IC 110.

In another embodiment, ICs 110 and 120 may operate independently or may operate at different data rates. It should be appreciated that the operating data rate may be determined by the frequency of the clock signals of ICs 110 and 120. In the example of FIG. 1, IC 110 may operate according to clock signal CLK1 exhibiting frequency f1, whereas IC 120 may operate according to clock signal CLK2 exhibiting frequency f2.

Integrated circuits 110 and 120 may further include clock generator circuitry 140 and clock generator circuitry 150, respectively. Clock generator circuitry 140 may generate clock signal CLK1 having frequency f1, whereas clock generator circuitry 150 may generate clock signal CLK2 having frequency f2. In one exemplary embodiment, f1 may be 250 megahertz (MHz) and f2 may be 500 MHz. Furthermore, clock generator circuitries 140 and 150 may be configured to generate clock signals with desired (predetermined) frequencies. In one embodiment, each of clock generator circuitries 140 and 150 may include a phase lock loop (PLL) circuit.

As shown in FIG. 1, interface circuitry 130 may be interposed between ICs 110 and 120. Interface circuitry 130 may support data communication between ICs 110 and 120 that are potentially operating at different data rates. Interface circuitry 130 may be operable to convert the data rate of data received from IC 110 to a suitable data rate associated with IC 120. Similarly, interface circuitry 130 may convert the data rate of data received from IC 120 to a suitable data rate associated with IC 110. Interface circuitry 130 may also be operable to deserialize a parallel data stream and/or to serialize a parallel data stream. For example, a parallel data stream received from either IC 110 or 120 may be converted to a serial data stream and vice versa. As an example, interface circuitry 130 may serve as an interface between IC 110 that operates at half data rate (HDR) and IC 120 that operates at double data rate (DDR). As another example, interface circuitry 130 may serve as an interface between IC 110 that operates at single data rate (SDR) and IC 120 that operates at DDR. In other suitable arrangements, both ICs 110 and 120 may operate at SDR.

Interface circuitry 130 may be coupled to IC 110 via interconnections 160 and may be coupled to IC 120 via interconnections 170. It should be appreciated that interconnections 160 and 170 may include a plurality of electrical pathways configured to convey electrical signals (e.g., clock signals, data signals, control signals, etc). Interface circuitry 130 may receive a clock signal having frequency f1 through one of interconnections 160 and may also receive another clock signal having frequency f2 from one of interconnections 170. Interface circuitry 130 may also be operable to transmit data between ICs 110 and 120 through interconnections 160 and 170.

Referring still to FIG. 1, there may be more interconnections 160 than interconnections 170. For example, there may be ten interconnections 160 coupling IC 110 to circuitry 130 and only five interconnections 170 coupling IC 120 to circuitry 130. Frequency f2 associated with data conveyed over interconnections 170 may, however, be two times frequency f1 associated with data conveyed over paths 160. Therefore, it should be appreciated that the data rate for IC 110 or IC 120 may be increased/decreased either by (i) increasing/decreasing the clock frequency or (ii) increasing/decreasing the rate of parallel data transfer.

In general, interface circuitry 130 may serve as an interface between any two integrated circuit devices. In one embodiment, interface circuitry 130 may be configured to couple two devices with different input-output (I/O) pin counts. For example, interface circuitry 130 may couple a memory module that has approximately 100 I/O pins to an FPGA that has approximately 1000 I/O pins.

If desired, interface circuitry 130 may be programmed in a similar manner as a programmable integrated circuit (e.g., a programmable logic device integrated circuit). In one embodiment, interface circuitry 130 may be programmed by configuring configuration random access memory (CRAM) bits. In one instance, interface circuitry 130 may be configured to interface IC 110 operating at SDR with IC 120 operating at DDR. In another instance, interface circuitry 130 may be configured to interface IC 110 operating at HDR with IC 120 operating at DDR, or may be configured to interface with ICs 110 and 120 when both ICs are operating at SDR.

Figure 2:
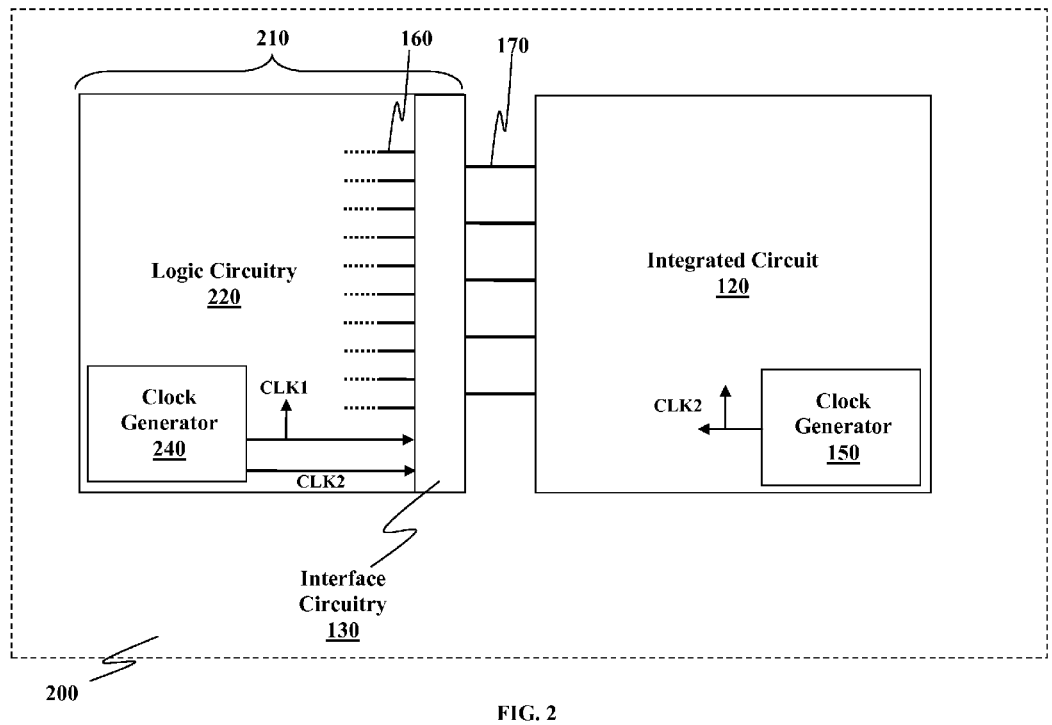
FIG. 2 is an IC system where interface circuitry forms a part of an integrated circuit in accordance with an embodiment of present invention.

FIG. 2, meant to be illustrative and not limiting, illustrates IC system 200 with IC 120 and IC 210 in accordance with one embodiment of the present invention. It should be appreciated that IC system 200 shares similarities with IC system 100 and as such, elements that have been described above (e.g., interface circuitry 130, interconnections 160 and 170, clock generator 150, etc.) will not be described in detail again.

As illustrated in FIG. 2, IC 210 may include interface circuitry 130 that is configured to interface with external circuit elements coupled to IC 210. In this instance, interconnections 160 are internal to IC 210. In one embodiment, IC 210 may be an FPGA where interface circuitry 130 enables IC 210 to be coupled to various devices (e.g., memory, another FPGA).

In the example of FIG. 2, IC 210 may include logic circuitry 220 and clock generator circuitry 240. It should be appreciated that logic circuitry 220 may be used to perform any variety of logic functions. For example, logic circuitry 220 may include programmable logic elements when IC 210 is a programmable logic device. Data may be transmitted between logic circuitry 220 and interface circuitry 130 via interconnections 160.

Clock generator circuitry 240 may generate clock signals CLK1 and CLK2 with different frequencies (e.g., f1 and f2). As an example, f1 may be 250 MHz and f2 may be 500 MHz. Both signals CLK1 and CLK2 may be transmitted to interface circuitry 130.

Figure 3:
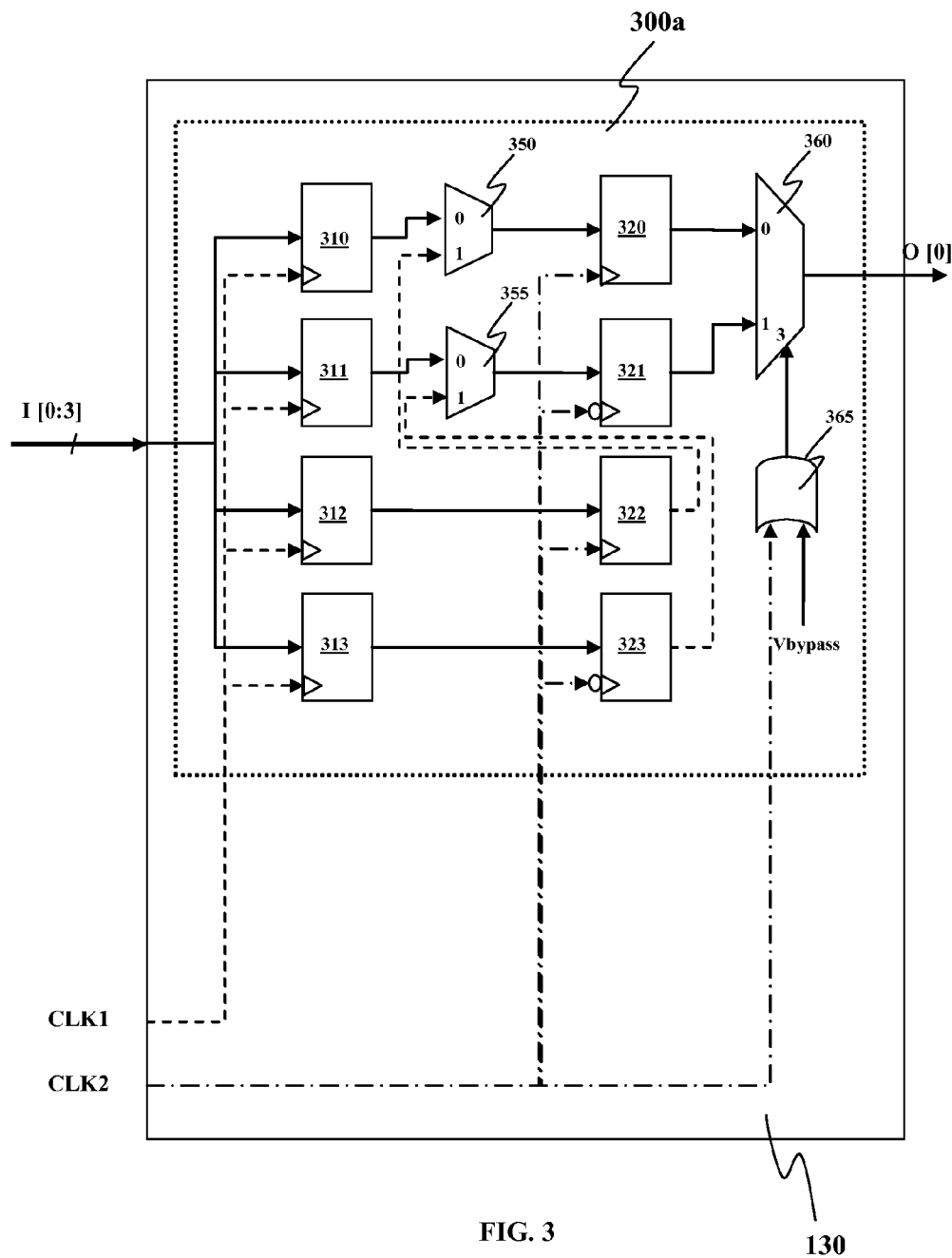
FIG. 3 shows interface circuitry that includes serializer circuitry in accordance with an embodiment of present invention.

FIG. 3, meant to be illustrative and not limiting, illustrates interface circuitry 130 that includes serializer 300a. In one suitable arrangement, serializer 300a may convert parallel data streams, represented by input I[0:3], to a serialized data stream, represented by output O[0]. Serializer 300a may receive input I[0:3] from IC 110 of FIG. 1 or logic circuitry 220 of FIG. 2. Serializer 300a may then output serialized data stream O[0] to IC 120 via interconnections 170 (see, FIGS. 1 and 2).

In the example of FIG. 3, serializer 300a includes registers 310-313 and 320-323, multiplexers 350, 355, and 360 and a logic OR gate 365. Each of registers 310-313 may receive at its input a respective input bit from parallel input I[0:3]. As illustrated in FIG. 3, register 310 may receive bit I[0] of the input signal at its input terminal, register 311 may receive bit I[1] at its input terminal, register 312 may receive bit I[2] at its input terminal, and register 313 may receive bit I[3] at its input terminal. Input bit I[0] is sometimes referred to as the least significant bit (LSB), whereas input bit I[3] is sometimes referred to as the most significant bit (MSB) of parallel input I[0:3].

Register 310-313 may also receive a first clock signal such as signal CLK1 at its clock terminal. The first clock signal CLK1 may exhibit frequency f1 that is equal to 250 MHz (as an example). Clock signal CLK1 may be generated using clock generator circuitry 140 of FIG. 1 of clock generator circuitry 240 of FIG. 2.

Referring still to FIG. 3, output terminals of registers 310 and 311 may be coupled to input terminal 0 of multiplexers 350 and 355, respectively. Output terminals of registers 312 and 313 may be coupled to corresponding input terminals of registers 322 and 323, respectively. It should be appreciated that registers 310-313 may latch input signal I[0:3] received at their input terminals when the first clock signal CLK1 transitions from a logic low level to logic high level (e.g., at rising edges of the clock signal).

As shown in FIG. 3, registers 320-323 may receive a second clock signal CLK2 at their respective clock terminals. The second clock signal CLK2 may have a frequency f2 that is equal to 500 MHz (as an example). Clock signal CLK2 may be generated by clock generator circuitry 150 of FIG. 1 or FIG. 2, or by clock generator circuitry 240 of FIG. 2. Registers 320 and 322 may be positive edge-triggered storage elements that capture input data when second clock signal CLK2 transitions from a logic low level to a logic high level (e.g., at rising edges of the second clock signal CLK2). As shown in FIG. 3, an inverter may be placed at the clock input terminal of each of registers 321 and 323. Accordingly, registers 321 and 323 may be negative edge-triggered storage elements that capture input data when the second clock signal CLK2 transitions from a logic high level to logic low level (e.g., at falling edges of the second clock signal CLK2).

The output terminal of register 322 and register 323 are coupled to input terminals 1 of multiplexer 350 and multiplexer 355, respectively. Hence, the input terminals 0 and 1 of multiplexer 350 may receive the outputs from register 310 and register 322, respectively. Accordingly, the input terminals 0 and 1 of multiplexer 355 may receive outputs from register 311 and register 323, respectively.

It should be appreciated that multiplexers 350 and 355 and registers 322 and 323 may collectively function to convert the four parallel streams of data (I[0:3]) into two parallel streams of data. In one embodiment, multiplexers 350 and 355 may be controlled by a register (not shown in FIG. 3 for simplicity). In another embodiment, multiplexers 350 and 355 may be controlled by a programmable logic element that provides logic values that may alternate between logic one and zero over time. It should be appreciated that multiplexers 350 and 355 may be configured accordingly to serialize a parallel data stream.

In the embodiment of FIG. 3, the output terminal of register 320 is coupled to input terminal 0 of multiplexer 360 and the output terminal of register 321 is coupled to input terminal 1 of multiplexer 360. It should be appreciated that multiplexer 360 may output one of the received signals at terminal 0 or terminal 1, depending on the control signal received at control terminal 3 of multiplexer 360. In one embodiment, the control terminal 3 of multiplexer 360 is coupled to the output of OR gate 365.

Logic OR gate 365 may receive the second clock signal CLK2 and a serializer bypass signal Vbypass. Signal Vbypass may controls whether serializer 300a is bypassed or is used to serialize the data. In one embodiment, signal Vbypass is at logic 0, so OR gate 365 outputs a signal with a logic value that corresponds directly with the logic value of the CLK2 signal. In an alternative embodiment, signal Vbypass is at logic 1, so OR gate 365 outputs a signal having a constant logic value (i.e., logic value of 1) and therefore disregards logic values of the CLK2 signal. Subsequently, the output of the OR gate 365 is transferred to multiplexer 360. The output controls whether to alternate signal propagation between the terminal 0 and 1, which may result in serialization, or remain propagation from only the terminal 1, which results in by-passing serialization.

Figure 4:
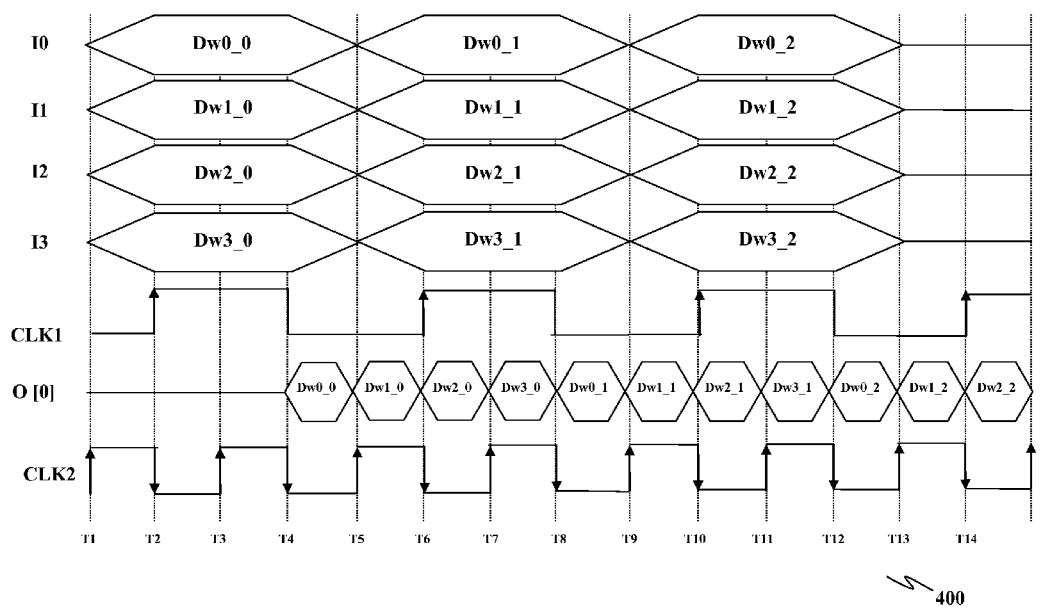
FIG. 4 shows waveforms of four parallel data streams serialized into a serial data stream in accordance with an embodiment of present invention.

FIG. 4, meant to be illustrative and not limiting, illustrates waveforms 400 of a parallel data stream I[0:3] and its serialized output O[0] in accordance with one embodiment. Waveforms 400 may represent the behavior of a serializer circuit (e.g., serializer 300a of FIG. 3) over time. In another embodiment, waveforms 400 may represent the serialization of a parallel data stream received from an FPGA prior to the transmission of the serialized data stream to a memory module.

The waveform of output O[0] in the embodiment of FIG. 4 may be an output generated by serializer 300a of FIG. 3. Clock signal CLK2 may be twice as fast as clock signal CLK1. For example, the frequency of clock signal CLK1 may be 250 MHz and the frequency of clock signal CLK2 may be 500 MHz.

As shown in FIG. 4, parallel input signal I[0:3] may be a 4-bit input signal with bits Dw0_0, Dw1_0, Dw2_0 and Dw3_0 available between the period T1-T5. Bits Dw0_0, Dw1_0, Dw2_0 and Dw3_0 may be the first four bits of the parallel data stream. Parallel input signal I[0:3] received between T1-T4 may be serialized by serializer 300a immediately after T4. The data Dw0_0, Dw1_0, Dw2_0 and Dw3_0 may be completely transferred out before T8.

As an example, the duration between T1 and T2, T2 and T3, and so on may be approximately 2 nanoseconds (ns). The parallel data stream is available for reading into serializer 300a of FIG. 3 from period T1 to T5 (a duration of approximately 8 ns). The serialized data stream may be sequentially output beginning from period T5 until T8 (a duration of approximately 6 ns). It is further appreciated that waveforms may vary depending on the number of parallel data streams. For example, they may be $2^n$-bit parallel data stream where n is a positive integer.

The ratio of frequency value for clock signals CLK1 and CLK2 may be equal to 1:2 (as an example). It should be appreciated that the second bits of the parallel streams (e.g., Dw0_1, Dw1_1, Dw2_1 and Dw3_1) and the subsequent bits of the parallel streams (e.g., Dw0_2, Dw1_2, Dw2_2 and Dw3_2) may be serialized in a similar manner as the first bits of the parallel streams.

Figure 5:
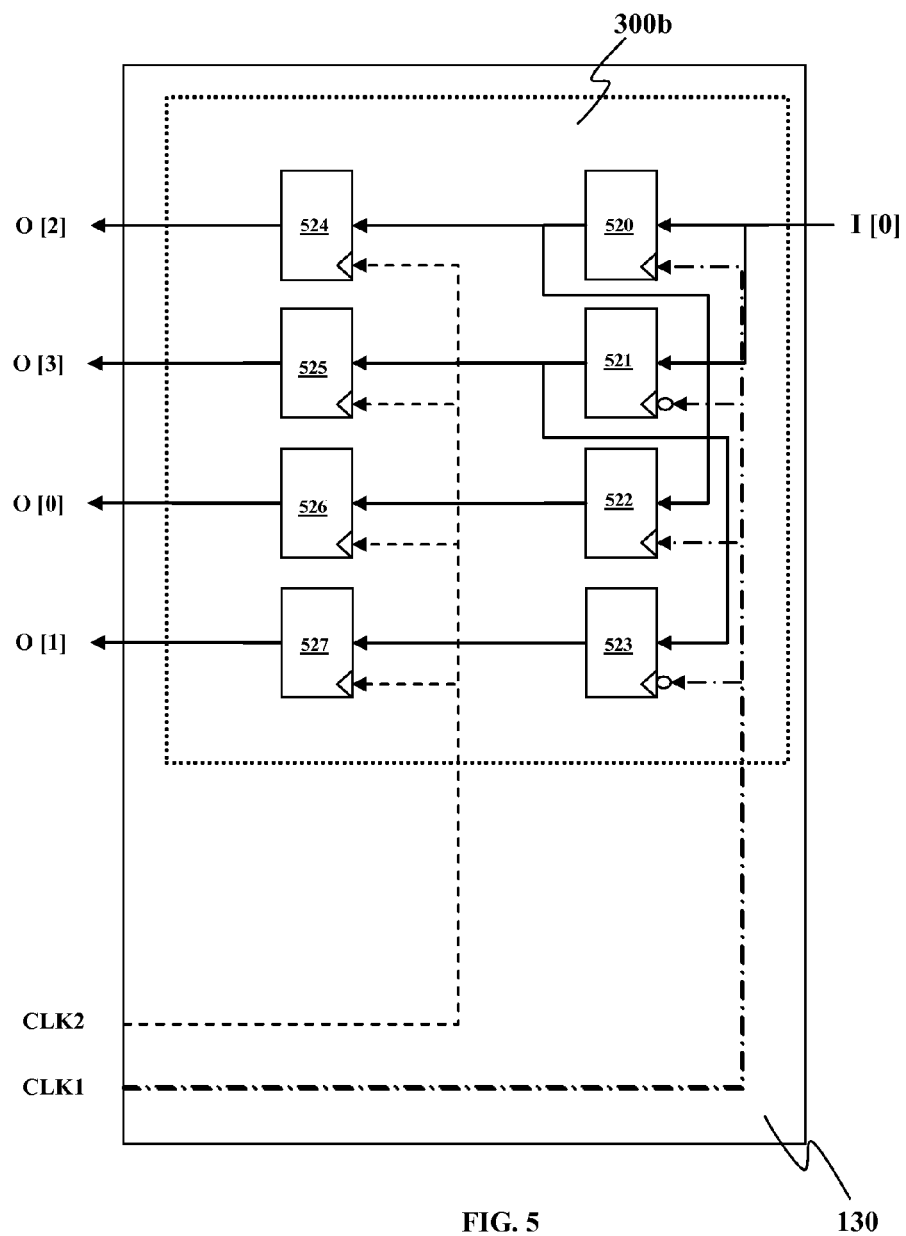
FIG. 5 shows interface circuitry that includes deserializer circuitry in accordance with an embodiment of present invention.

FIG. 5 illustrates interface circuitry 130 that includes deserializer 300b in accordance with one embodiment. In this exemplary embodiment, deserializer 300b may convert a serial stream of data, represented by input I[0], to a parallel stream of data, represented by output array O[0:3]. In one embodiment, deserializer 300b may receive the I[0] from interconnections 170 of FIG. 1 or FIG. 2, and may output array I[0:3] to interconnections 160 of FIG. 1 or FIG. 2.

Deserializer 300b may include registers 520-527 coupled in a manner as illustrated in FIG. 5. Registers 520 and 521 receive input I[0] at their respective input terminals. Each register of registers 520-523 may also receive a first clock signal (e.g., CLK1 which has a frequency value of f1) at its clock input terminal. As shown in FIG. 5, the clock terminals of registers 521 and 523 may be active low clock terminals. Accordingly, data or signals may be captured by registers 521 and 523 when the first clock signal CLK1 transitions from a logic high level to a logic low level. Conversely, the clock terminals of registers 520 and 522 may be active high clock terminals and as such, registers 520 and 522 may capture input data when the first clock signal CLK1 transitions from a logic low level to a logic high low.

Registers 520 and 522 may be coupled together to form a first two-register chain, whereas registers 521 and 523 may be coupled together to form a second two-register chain. As illustrated in FIG. 5, the output terminal of register 520 may be coupled to the input terminal of register 522, whereas the output terminal of register 521 may be coupled to the input terminal of register 523.

The output terminals of registers 520-523 may be coupled to the input terminals of registers 524-527, respectively. Registers 524-527 may output four bits of data O[0:3]. In the exemplary embodiment of FIG. 5, register 524 outputs data bit O[2]; register 525 outputs data bit O[3]; register 526 outputs data bit O[1]; and register 527 outputs data bit O[0]. Registers 524-527 may also receive a second clock signal (e.g., CLK2) having a frequency value of f2, at their clock terminals. In one exemplary embodiment, the frequency of the second clock signal f2 may be equal to 250 MHz and the frequency of the first clock signal f1 may be equal to 500 Mhz.

Figure 6:
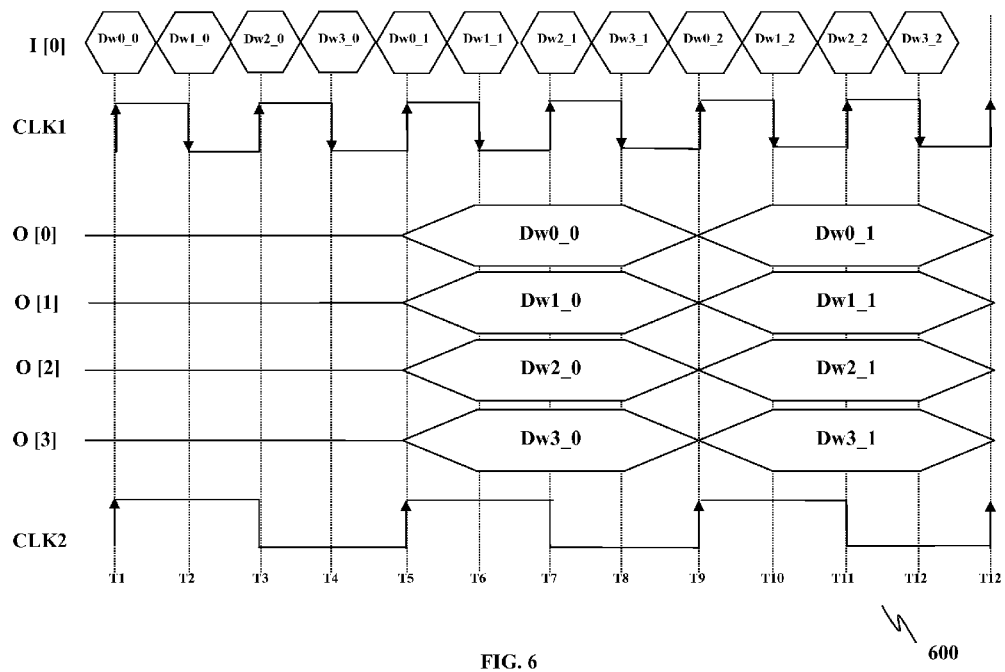
FIG. 6 shows waveforms of a serial data stream deserialized into four parallel data streams in accordance with an embodiment of present invention.

FIG. 6 shows waveforms 600, where a serial stream of data I[0] is deserialized to a data stream O[0:3]. As shown in FIG. 6, waveforms 600 may represent the behavior of a deserializer circuit (e.g., deserializer 300b of FIG. 5) over time. In another suitable arrangement, waveforms 600 may represent the deserialization of a serial data stream received from a memory module prior to the transmission of the deserialized data stream to an FPGA device.

The outputs O[0:3] may be generated by deserializer 300b when deserializer 300b receives CLK2 signal having a frequency of half in value compared to CLK1. For example, frequency of signal CLK2 may be 250 MHz, whereas the frequency of signal CLK1 may be at 500 MHz.

In the embodiment of FIG. 6, the serial data stream I[0] may include bits of Dw0_0, Dw1_0, Dw2_0 and Dw3_0 received by deserializer 300b during the period of T1-T4. The serial data stream is deserialized and is output as deserialized data stream O[0:3] at T5. The data may complete its deserialization and be outputted by T9.

The subsequent bits within the serial data stream (e.g., Dw0_1, Dw1_1, Dw2_1, Dw3_1, Dw0_2, Dw1_2, Dw2_2 and Dw3_2) may be deserialized and be output in similar manner as described for bits Dw0_0, Dw1_0, Dw2_0 and Dw3_0.

Figure 7:
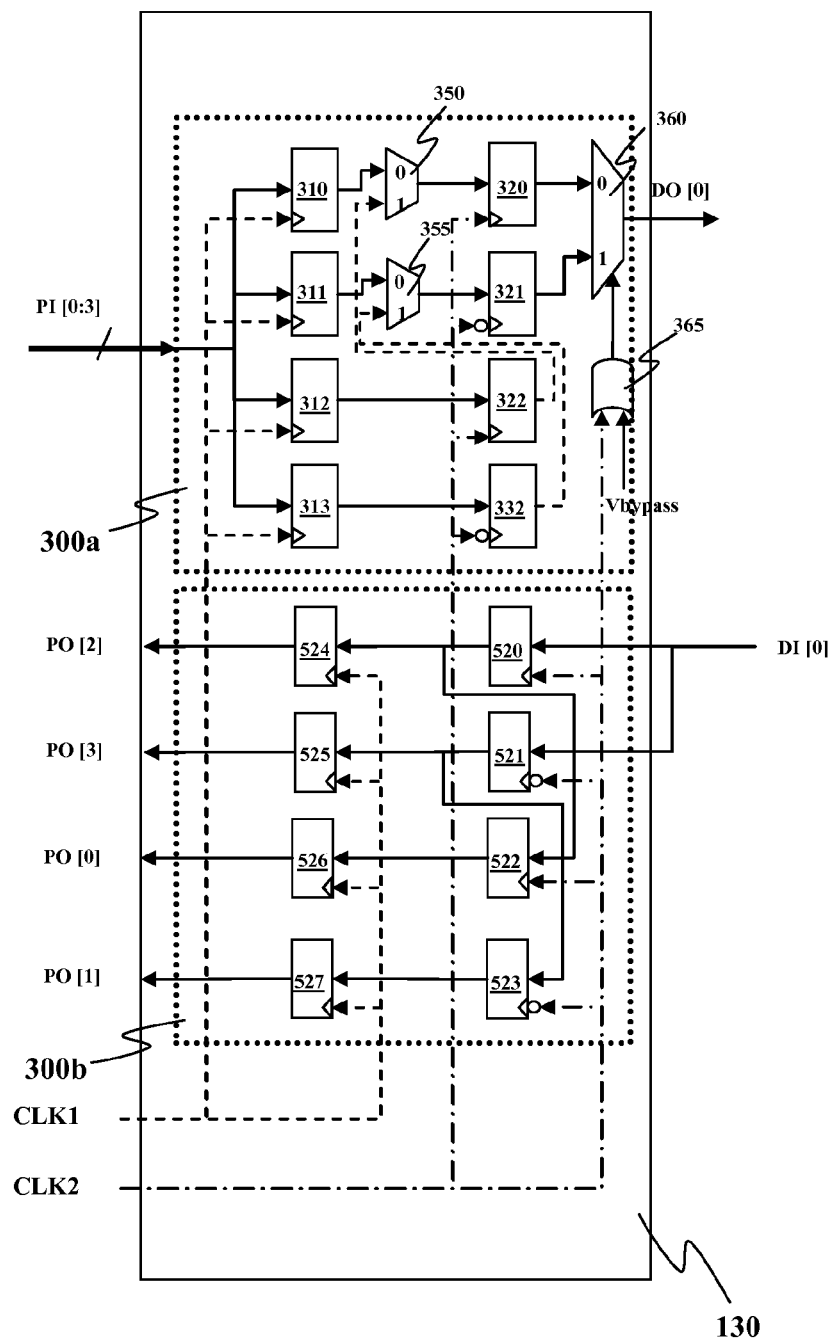
FIG. 7 shows interface circuitry operable to convert data between half data rate and double data rate in accordance with an embodiment of present invention.

FIG. 7, meant to be illustrative and not limiting, illustrates interface circuitry 130 that converts data between a half data rate (i.e., HDR) and a double data rate (i.e., DDR). Interface circuitry 130 may include both serializer 300a and deserializer 300b and circuitry for enabling such conversions. It should be appreciated that circuitry that includes serializer 300a and deserializer 300b may be known collectively as a serializer-deserializer (SERDES) circuit.

In one embodiment, interface circuitry 130 may be utilized to couple an FPGA device with 4N input/outputs (I/Os) that operates at HDR to a memory module with N I/Os that operates at DDR, where N is a positive integer. In one embodiment, an HDR interface may include data transfers with a 250 MHz clock, and a DDR interface may include data transfers with a 500 MHz clock. It should be appreciated that the DDR interface may further support the transmission of data at both the rising and falling edges of a clock signal. The HDR interface, on the other hand, may transmit data at rising edges of the clock signal.

In an exemplary embodiment, serializer 300a and deserializer 300b may be similar to serializer 300a of FIG. 3 and deserializer 300b of FIG. 5 respectively. Serializer 300a and deserializer 300b may also be configured in a similar manner as described above. For example, serializer 300a and deserializer 300b may be configured to include a bypass signal (e.g., Vbypass of FIG. 3) at a logic low level (e.g., logic 0), a first clock signal with a first frequency (e.g., CLK1 of FIGS. 3 and 5), a second clock signal with a second frequency (e.g., CLK2 of FIGS. 3 and 5), and multiplexers operable to transmit different signals based on the second clock signal (e.g., multiplexers 350 and 355 of FIG. 3).

In the example of FIG. 7, serializer 300a may convert an HDR parallel data input (e.g., PI[0:3]) to a DDR serialized output DO[0], and deserializer 300b may convert a DDR serial input (e.g., DI[0]) to an HDR parallel data output (e.g., PO[0:3]). It should be appreciated that serializer 300a and deserializer 300b may function independently from each another. In one instance, both serializer 300a and deserializer 300b may function simultaneously. In another instance, serializer 300a and deserializer 300b may be activated one at a time.

Figure 8:
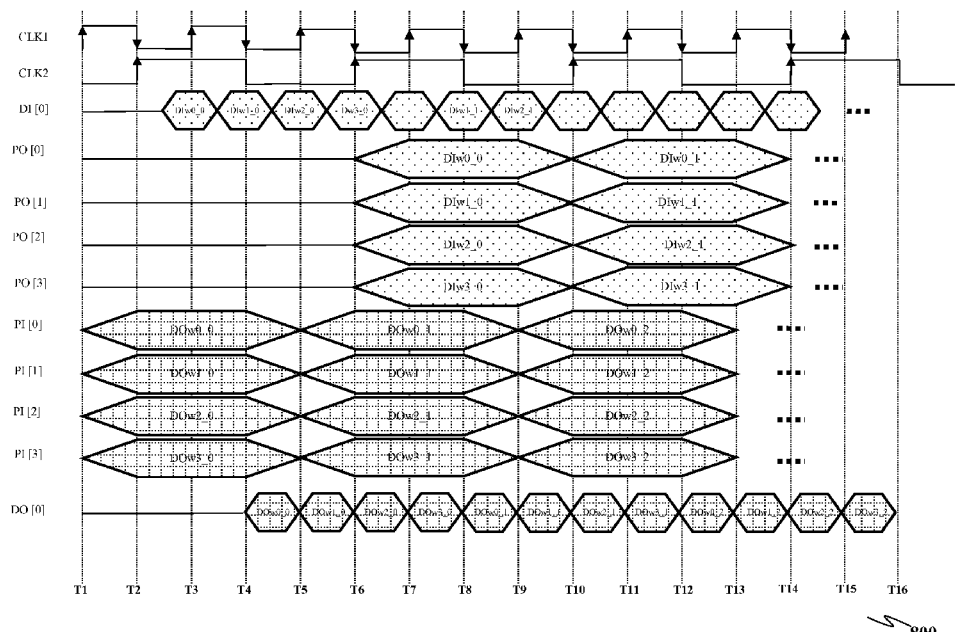
FIG. 8 provides waveforms for data received and converted using serializer and deserializer circuits of the type shown in FIG. 7 in accordance with an embodiment of present invention.

FIG. 8, meant to be illustrative and not limiting, illustrates waveforms 800 for data received and converted accordingly by serializer 300a and deserializer 300b of FIG. 7 in accordance with one embodiment. The data may be converted between two data rates (e.g., HDR and DDR). In one embodiment, the data received may include PI[0:3] and DI[0], and output data may include DO[0] and PO[0:3]. It should be appreciated that waveforms 800 may be understood upon understanding waveforms 400 and waveforms 600.

Waveforms 800 show a four-bit parallel stream (i.e., PI[0:3] received by serializer 300a of FIG. 7) converted to a serial data stream (i.e., DO[0]). The first four bits of PI[0:3] that are received at period T1 may include Dow0_0, Dow1_0, Dow2_0 and Dow3_0. At period T4, a serial data stream DO[0] may be output.

Waveforms 800 also include a serial data stream (i.e., DI[0]) that may be received by deserializer 300b of FIG. 7 and may be converted to a parallel data stream (i.e., PO[0:3]). Serial data stream DO[0] may include multiple data bits (e.g., DIw0_0, DIw1_0, DIw2_0, DIw3_0, etc.) that are received sequentially. As illustrated in FIG. 8, the first bit of serial data stream DI[0] (i.e., DIw0_0) is received at time T3. Subsequent data bits of serial data stream DI[0] may be received at over time (e.g., at period T4, T5, T6, and so on). The first four bits of serial data stream DI[0] (DIw0_0, DIw1_0, DIw2_0, DIw3_0) may form a first four-bit parallel data stream PI[0:3]. Parallel data stream PO[0:3] may be generated by the deserializer circuit (e.g., deserializer 300b of FIG. 7) at time T6.

Figure 9:
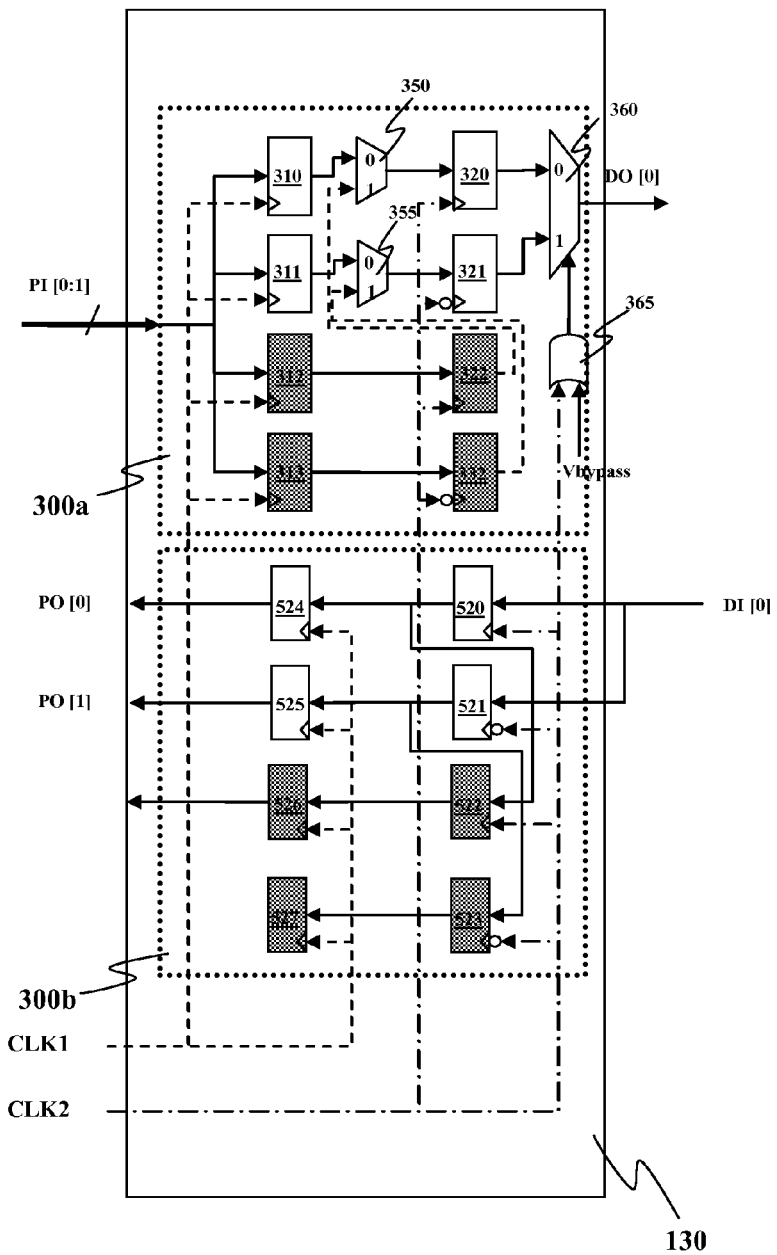
FIG. 9 shows interface circuitry operable to convert data between single data rate and double data rate in accordance with an embodiment of present invention.

FIG. 9 illustrates interface circuitry 130 that converts data between single data rate (i.e., SDR) and double data rate (i.e., DDR). In one embodiment, interface circuitry 130 may be coupled between an FPGA that operates at SDR and has 2N I/O pins and a memory module that operates at DDR having N I/O pins, where N is a positive integer. As an example, SDR and DDR may be data rate that operates at a clock signal having frequency of 500 MHz. Furthermore, the DDR may be a data rate that transmits data at rising-edge and falling-edge of the clock signal whereas SDR may be a data rate that transmits data at rising-edge of the clock signal. It should be appreciated that interface circuitry 130 includes identical circuits as per interface circuitry 130 illustrated in FIG. 7. However, interface circuitry 130, in this embodiment, is configured to activate only a portion of circuitry (e.g., circuits which are not checkered) within serializer 300a and deserializer 300b.

In the embodiment of FIG. 9, only registers 310, 311, 320, 321, 520, 521, 524, 525 may be activated. Multiplexers 350 and 355 may receive a control signal which is tied to a logic low level (e.g., logic 0). The remaining circuits are deactivated, as illustrated by checkered representations in FIG. 9. Therefore, signals received at the first input terminal (e.g., terminal 0) may be transmitted through multiplexers 350 and 355. Signal Vbypass, in this instance, may be at a low logic level and both clock signals (e.g., CLK1 and CLK2) may have the same frequency (e.g., 500 MHz).

Therefore, in one embodiment, a two-bit parallel SDR data stream (i.e., PI[0:1]) may be received by serializer 300a and converted to a serial DDR data stream (i.e., DO[0]). Accordingly, a serial DDR data stream (i.e., DI[0]) may be received by deserializer 300b and converted to a two-bit SDR parallel data stream (i.e., PO[0:3]).

Figure 10:
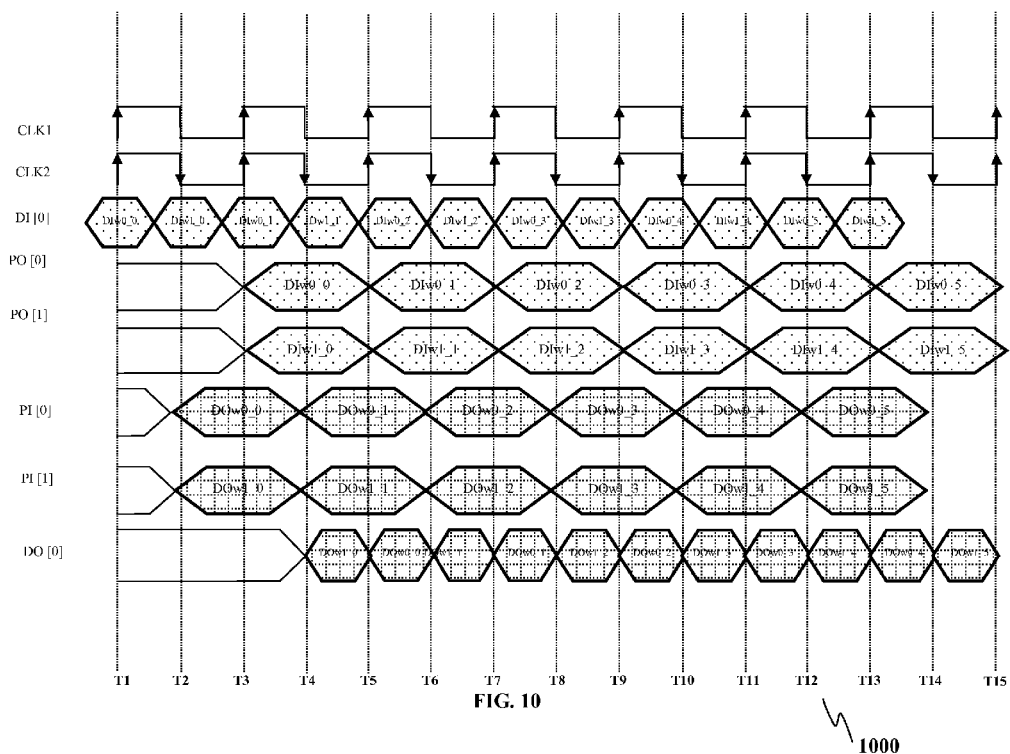
FIG. 10 provides waveforms for data received and converted using serializer and deserializer circuits of the type shown in FIG. 9 in accordance with an embodiment of present invention.

FIG. 10, meant to be illustrative and not limiting, illustrates waveforms 1000 for data received and converted accordingly by serializer 300a and deserializer 300b of FIG. 9 in accordance with one embodiment. The data may be converted between two data rates (e.g., between SDR and DDR). In one embodiment, the data received may include PI[0:1] and DI[0] and the output data may include DO[0] and PO[0:1]. In this exemplary embodiment, waveforms 1000 shows a 2-bit parallel streams of data (i.e., PI[0:1]) that may be received by serializer 300a as configured in FIG. 9, and be converted to a serialized stream of data (i.e., DO[0]). The first two bits of PI[0:1], received after T2, includes D0w0_0 and D0w1_0. Signal DO[0] is output starting at time T4.

Waveforms 1000 also include a serial stream of data (i.e., DI[0]) which may be received by deserializer 300b as configured in FIG. 9 be converted to parallel streams of data PO[0:1]. The DI[0] may include multiple data bits DIw0_0, DIw1_0, etc, received in sequentially. As illustrated in FIG. 9, the first data bit DIw0_0 may be received at T1, the second data bit may be received at T2 and so on. The first two bits of the DI[0] of the serial stream may form the first bits in the two-bit parallel data stream PI[0:1]. The parallel data stream may be generated by deserializer circuit (e.g., deserializer 300b of FIG. 9) at period after T3.

Figure 11:
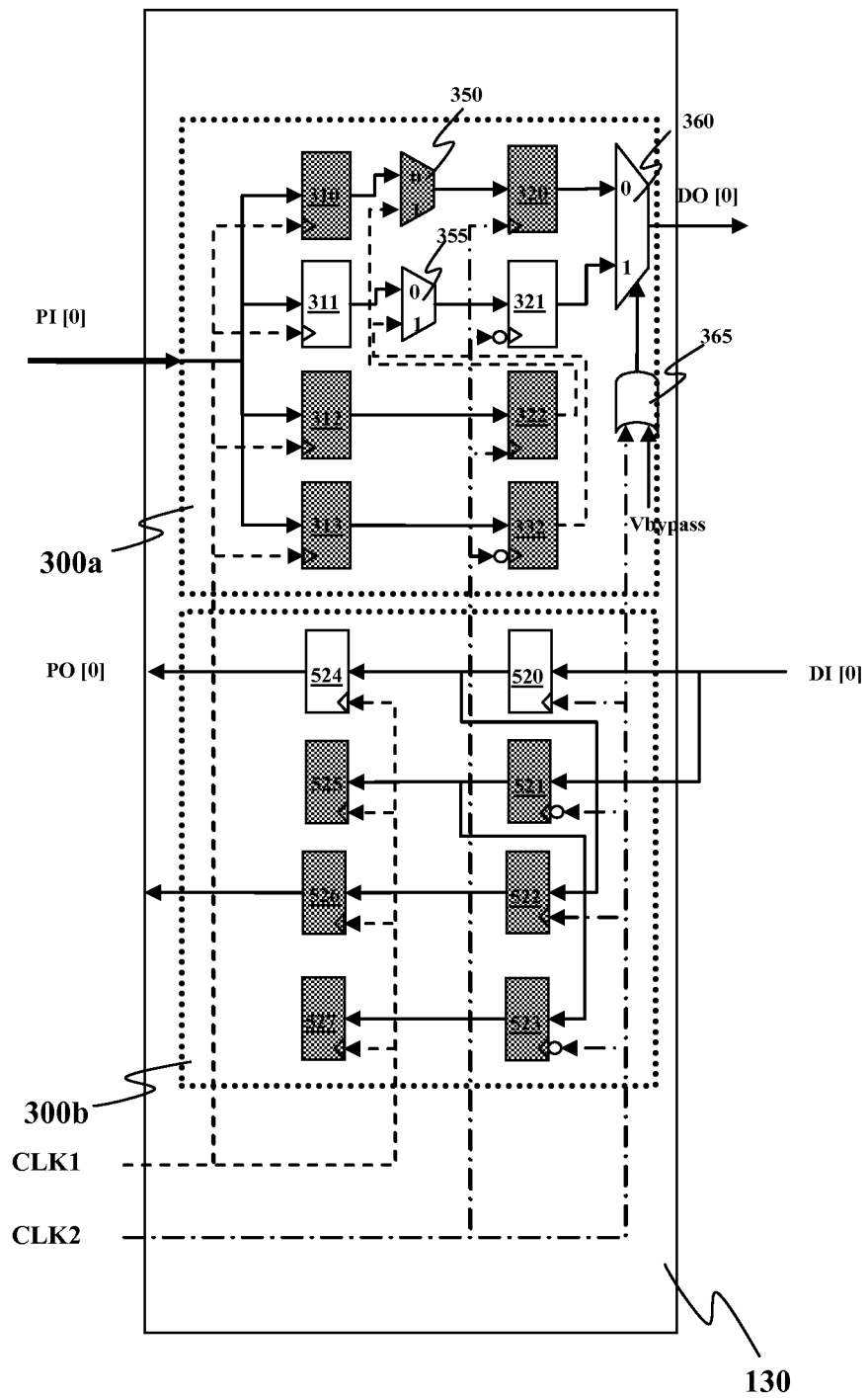
FIG. 11 shows illustrative interface circuitry configured to pass through data without modification in accordance with an embodiment of present invention.

FIG. 11, meant to be illustrative and not limiting, illustrates interface circuitry 130 that is configured to allow data to pass through without conversion in accordance with one embodiment. In one embodiment, interface circuitry 130 may be coupled between an FPGA with N number of I/Os that operates at a single data rate and a memory module having the same number of I/Os and operating at the same frequency. In the embodiment of FIG. 11, interface circuitry 130 is configured to activate only a portion of the circuitry (circuits that are not checkered) within serializer 300a and deserializer 300b.

In the exemplary embodiment of FIG. 11, registers 311, 321, 520 and 524, multiplexers 355 and 360, and logic gate 365 are activated. The remaining circuits are deactivated as represented by checkered in FIG. 11. Multiplexer 355 may receive a control signal which is tied to a logic low level (e.g., logic 0) so that signals (e.g., DI[0]) received at its first terminal (e.g., terminal 0) may be transmitted. The Vbypass signal may be tied to logic high value, or logic 1, and clock signals CLK1 and CLK2 may have the same frequency, (e.g., 500 MHz). In this instance, the input data stream, DI[0], may not be modified in any way and the same data stream may be transmitted as an output data stream (e.g., PO[0]) at the output terminal of interface circuitry 130.

Figure 12:
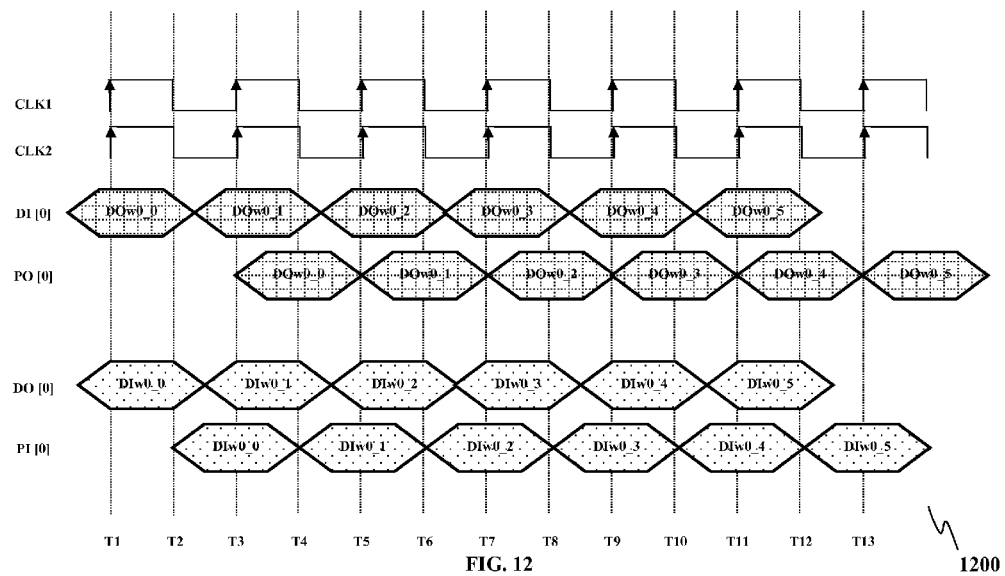
FIG. 12 provides waveforms received and passed through serializer and deserializer circuits of the type shown in FIG. 11 in accordance with an embodiment of present invention.

FIG. 12 illustrates waveforms 1200 for data received and passes through serializer 300a and deserializer 300b in FIG. 11 in accordance with one embodiment. Waveforms 1200 illustrate the passing of the data through interface circuitry 130 without any alterations in terms of the data rate and its parallelism. However, it should be appreciated that the output data is delayed by a few clock cycles due to its propagation through the respective serializer 300a or deserializer 300b.

In this exemplary embodiment, waveforms 1200 includes a data stream PI[0] that may be received by serializer 300a of FIG. 11 and be outputted as data stream DO[0]. The data stream PI[0] may include multiple data bits DIw0_0, DIw0_1 and so on. The data bit DIw0_0 may be received at T1 and the subsequent data bit DIw0_1 may be received at T3. The data stream DO[0] may be outputted after the period T3.

Waveforms 1200 also includes a data stream DI[0] that may be received by deserializer 300b as configured in FIG. 11 and be outputted as a data stream PO[0]. The data stream DO[0] includes multiple data bits, e.g., D0w0_0, D0w1_0 and so on. The data bit D0w0_0 may be received at T1 and the subsequent data bit D0w1_0 is received at T3 and so on. It should be appreciated that each bits in the data stream DO[0] may be received sequentially. The first bit of data stream PO[0] is outputted after T3 and the second bit of data stream PO[0] is outputted after T5 and so on.

Figure 13:
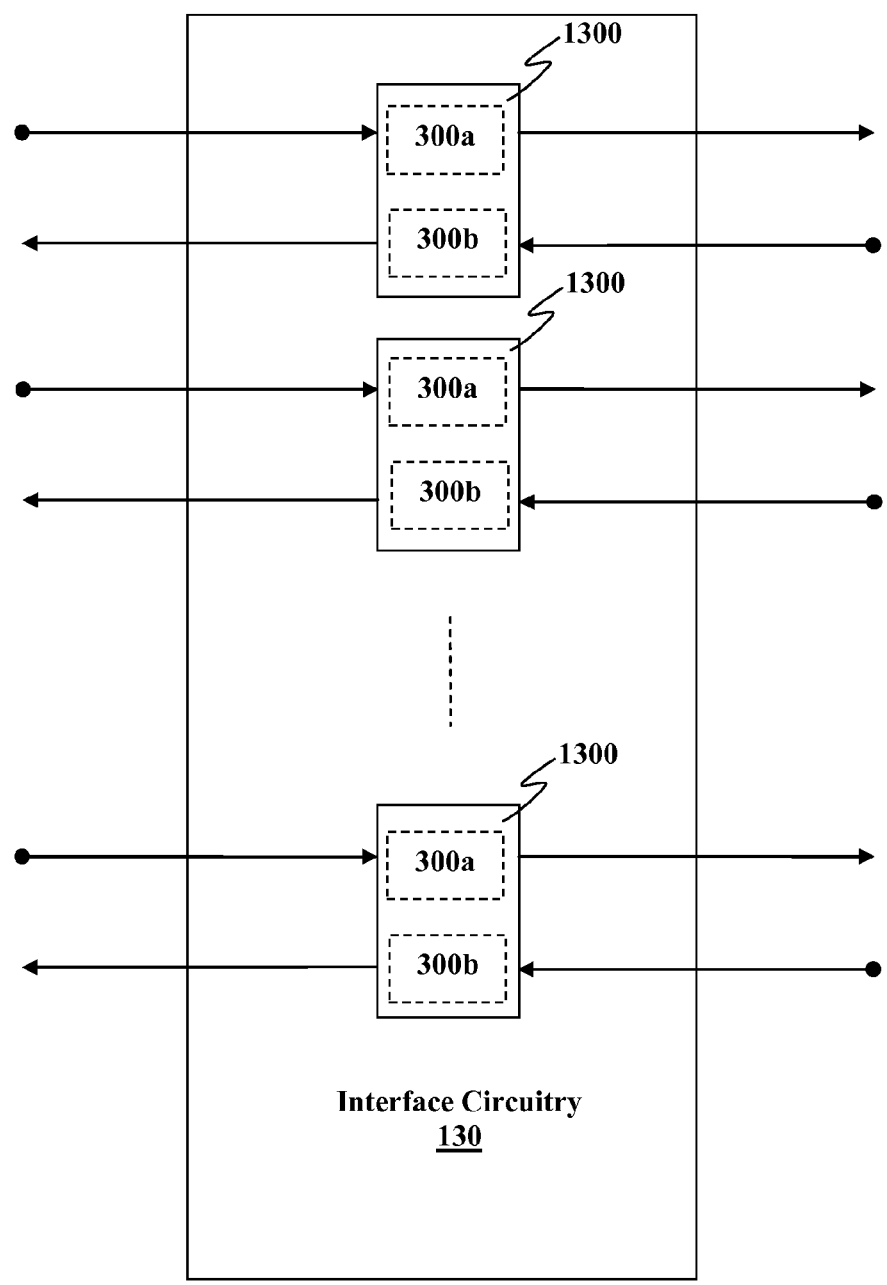
FIG. 13 shows interface circuitry having a plurality of serializer and deserializer (SERDES) circuits in accordance with one embodiment of present invention.

FIG. 13 illustrates interface circuitry 130 with a plurality of SERDES circuitry 1300. Each SERDES circuitry 1300 may include serializer 300a and deserializer 300b. Each serializer 300a and deserializer 300b within SERDES circuitry 1300 may be configured so that they may interface with ICs that may have any one of a variety of data rates (e.g., HDR, SDR or DDR). In one embodiment, there may be at least 72 SERDES circuitry 1300 in interface circuitry 130 to enable coupling between a first IC (which may have 72 I/Os, 144 I/Os or 216 I/Os) and a second IC (which may have 72 I/Os).

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. Circuitry comprising:
    a first integrated circuit operable to output a parallel data stream at a first data rate;
    a second integrated circuit operable to output a serialized data stream at a second date rate, wherein the second data rate is different than the first data rate; and
    interface circuitry coupled between the first integrated circuit and the second integrated circuit, wherein the interface circuitry is operable to serialize the parallel data stream received from the first integrated circuit, wherein the interface circuitry is further operable to deserialize the serialized data stream received from the second integrated circuit, and wherein the first data rate is lower than the second data rate.

2. The circuitry defined in claim 1 wherein the interface circuitry is operable to receive a first clock signal and a second clock signal, wherein the first clock signal controls the first data rate and wherein the second clock signal controls the second data rate.

3. The circuitry defined in claim 2 wherein the interface circuitry further comprises:
    a multiplexer operable to receive a first data bit and a second data bit from the parallel data stream and is supplied with a second clock signal, wherein the multiplexer has an output, wherein the multiplexer is further operable to transfer the first data bit to its output during a first logic state of the second clock signal and to transfer the second data bit to its output during a second logic state of the second clock signal.

4. The circuitry defined in claim 1 wherein the interface circuitry comprises:
    at least one serializing circuit operable to serialize the parallel data stream; and
    at least one deserializing circuit operable to deserialize the serialized data stream.

5. The circuitry defined in claim 4 wherein the serializing circuit further comprises:
    a first register operable to receive a first data bit of the parallel data stream;
    a second register operable to receive a second data bit of the parallel data stream;
    a third register coupled to an output of the second register;
    a multiplexer that is coupled to an output the first register and to an output of the third register; and
    a fourth register that is coupled to an output of the multiplexer.

6. The circuitry defined in claim 4 wherein the deserializing circuit further comprises:
    a plurality of first registers, wherein the first registers are coupled in a chain, and wherein one of the first registers in the chain is operable to receive the serialized data stream at the second data rate; and
    a plurality of second registers, wherein the second registers are operable to receive a portion of the serialized data stream from one of the first registers.

7. The circuitry defined in claim 1 wherein the first integrated circuit comprises a programmable integrated circuit and the second integrated circuit comprises a memory device.

8. An integrated circuit comprising:
    logic circuitry that operates at a first data rate; and
    interface circuitry that is coupled to the logic circuitry and that receives first and second clock signals, wherein the interface circuitry receives a parallel data stream at the first data rate from the logic circuitry and converts the parallel data stream into a serialized data stream at a second data rate, wherein the interface circuitry outputs a first data bit during a first logic state of the second clock signal and wherein the interface circuitry outputs a second data bit during a second logic state of the second clock signal.

9. The integrated circuit defined in claim 8, wherein the interface circuitry is operable to receive a serialized data stream and to convert the serialized data stream into another parallel data stream.

10. The integrated circuit defined in claim 8, wherein the first clock signal exhibits a clock rate that is equal to half of the clock rate of the second clock signal.

11. The integrated circuit defined in claim 8, wherein the first data rate exhibits a data rate that is equal to a quarter of the data rate of the second data rate.

12. The integrated circuit defined in claim 8, wherein the interface circuitry comprises:
    at least one serializing circuit operable to serialize a portion of the parallel data stream; and
    at least one deserializing circuit operable to deserialize a portion of the serialized data stream.

13. The integrated circuit defined in claim 12, wherein the interface circuitry further comprises:
    a multiplexer operable to receive the first data bit and the second data bit from the parallel data stream and to receive the second clock signal, wherein the multiplexer is further operable to transfer the first data bit during the first logic state of the second clock signal and the second data bit during the second logic state of the second clock signal.

14. The integrated circuit defined in claim 13, wherein the deserializing circuit further comprises:
    a first plurality of registers coupled in a chain, wherein a register in the first plurality of registers is operable to receive the serialized data stream; and
    a second plurality of registers operable to receive a portion of the serialized data stream from the register in the first plurality of registers.

15. The integrated circuit defined in claim 12, wherein the serializing circuit further comprises:
    a first plurality of registers operable to receive a first portion of the parallel data stream;
    a second plurality of registers operable to receive a second portion of the parallel data stream;

a third plurality of registers, wherein a register from the third plurality of registers is coupled to a register from the second plurality of registers;

a plurality of multiplexers, wherein a first multiplexer from the plurality of multiplexers is coupled to a register from the first plurality of registers and to another register from the third plurality of registers; and a fourth plurality of fourth registers coupled to a second multiplexer from the plurality of multiplexers.

16. The integrated circuit defined in claim 8, wherein the first clock signal exhibits a clock rate that is different from the clock rate of the second clock signal.

17. Interface circuitry comprising:

serializing circuitry operable to convert a first parallel data stream received at a first data rate to a first serialized data stream provided at a second data rate;

deserializing circuitry operable to convert a second serialized data stream received at the second data rate to a second parallel data stream provided at the first data rate;

a first register controlled by a first clock signal;

a second register controlled by a second clock signal; and multiplexing circuitry interposed between the first and second registers.

18. The interface circuitry defined in claim 17 wherein the serializing circuitry comprises:

the first register, wherein the first register is operable to receive the first clock signal and a first bit of the first parallel data stream;

a third register operable to receive the first clock signal and a second bit of the first parallel data stream;

the second register, wherein the second register is operable to receive the second clock signal and an output of the third register;

a multiplexer operable to receive an output of the first register and an output of the second register; and a fourth register operable to receive the second clock signal and an output of the multiplexer.

19. The interface circuitry defined in claim 17 wherein the deserializing circuitry further comprises:

a third register operable to receive the second clock signal and the second serialized data stream;

a fourth register operable to receive the second clock signal and an output from the third register;

a fifth register operable to receive the first clock signal and the output of the third register; and a sixth register operable to receive the first clock signal and an output of the fourth register.

20. The interface circuitry defined in claim 17 wherein the second data rate exhibits a data rate that is at least two times the first data rate.

21. The interface circuitry defined in claim 17, wherein the interface circuitry is coupled to an integrated circuit, wherein the serializing circuitry is operable to transfer data out of the integrated circuit, and wherein the deserializing circuitry is operable to receive data for the integrated circuit.

22. The interface circuitry defined in claim 17, wherein the interface circuitry is coupled to a selected one of a memory device, a microprocessor, an application specific integrated circuit (ASIC), and an application specific standard product (ASSP).

\* \* \* \* \*